Figure 1:
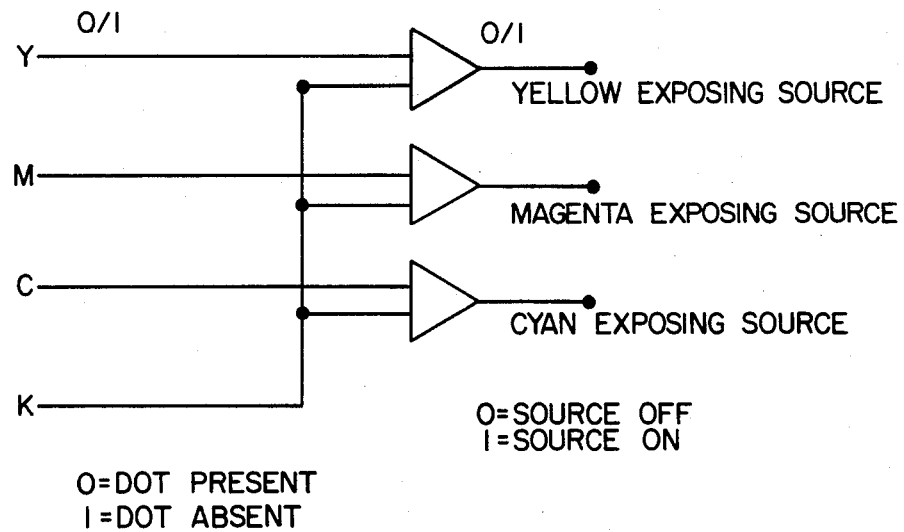

United States Patent

Powers et al.

[11] Patent Number: 4,818,663
[45] Date of Patent: Apr. 4, 1989

[54] PHOTOGRAPHIC MATERIALS AND COLOR PROOFING SYSTEM

[75] Inventors: Stephen R. Powers; Thomas D. G. Hellings, both of Harlow, United Kingdom

[73] Assignee: Minnesota Mining and Manufacturing Company, St. Paul, Minn.

[21] Appl. No.: 34,001

[22] Filed: Apr. 2, 1987

[30] Foreign Application Priority Data

Apr. 15, 1986 [GB] United Kingdom ................. 8609132

[51] Int. Cl.$^4$ ........................ G03C 1/46; G03C 1/485
[52] U.S. Cl. .................................... 430/358; 430/212; 430/217; 430/364; 430/505; 430/506; 430/507; 430/509; 430/940
[58] Field of Search ............... 430/358, 505, 506, 217, 430/212, 507, 364, 509, 940

[56] References Cited

U.S. PATENT DOCUMENTS

| | | | |
|---|---|---|---|
| 2,125,015 | 7/1938 | Gaspar | 430/505 |
| 3,576,627 | 4/1971 | Wirth | 430/358 |
| 3,796,575 | 3/1974 | Kirsch | 430/358 |
| 4,416,522 | 11/1986 | Webster | 354/4 |
| 4,619,892 | 10/1986 | Simpson et al. | 430/505 |
| 4,705,745 | 11/1987 | Kitchin et al. | 430/505 |

FOREIGN PATENT DOCUMENTS

| | | | |
|---|---|---|---|
| 746439 | 11/1966 | Canada | 430/358 |
| 867518 | 5/1961 | United Kingdom | 430/358 |

OTHER PUBLICATIONS

Research Disclosure 18362, Jul. 1979.

Primary Examiner—Paul R. Michl
Assistant Examiner—Lee C. Wright
Attorney, Agent, or Firm—Donald M. Sell; Mark A. Litman

[57] ABSTRACT

A radiation-sensitive element suitable for the preparation of half-tone color proofs comprising a substrate bearing at least four separate positive acting imaging media coated thereon, said imaging media including:

(1) an imaging medium capable of forming a yellow image upon imagewise exposure and processing,
(2) an imaging medium capable fo forming a magenta image upon imagewise exposure and processing,
(3) an imaging medium capable of forming a cyan image upon imagewise exposure and processing, and
(4) an imaging medium capable of forming a black image or a balancing black image upon imagewise exposure and processing, each imaging medium (1), (2) and (3) having a maximum spectral sensitivity at a wavelength different from that of the maxiumu sensitivity of the other imaging medium of (1) to (3), the imaging medium (4) having spectral sensitivity at each of the wavelengths of the maximum sensitivity of the other imaging media.

17 Claims, 5 Drawing Sheets

ELECTRONIC CONFIGURATION
"AND" GATES

FIG. 2

CONTROL

| TOP COAT |
|---|
| (EM. A)(YELLOW)(580 nm) |
| INTERLAYER |
| (EM. A)(MAGENTA)(660 nm) |
| INTERLAYER |
| (EM. A)(CYAN)(800 nm) |
| A.H.U. OVERCOAT |
| A.H.U. |
| BASE |

INVENTION

| | |
|---|---|
| | TOP COAT |
| IV | (EM. B)(CYAN)(580,660 & 800 nm) |
| | INTERLAYER |
| III | (EM. A)(YELLOW)(580 nm) |
| | INTERLAYER |
| II | (EM. A)(MAGENTA)(660 nm) |
| | INTERLAYER |
| I | (EM. A)(CYAN)(800 nm) |
| | A.H.U. OVERCOAT |
| | A.H.U. |
| | BASE |

DYE ABSORPTION SPECTRA
THREE LAYER COATING

DYE ABSORPTION SPECTRA

PHOTOGRAPHIC MATERIALS AND COLOR PROOFING SYSTEM

FIELD OF THE INVENTION

This invention relates to radiation-sensitive elements and in particular to radiation-sensitive elements suitable for colour proofing. A further aspect of the invention relates to a process of forming a half-tone colour image suitable for colour proofing.

BACKGROUND TO THE INVENTION

The process of colour printing by photolithography involves the separation of the colours of the image into a number of components (usually four) to be reproduced by printing inks of corresponding colour (usually yellow, magenta, cyan and black).

Each colour separation is converted into the form of a halftone dot pattern by which tone rendition is achieved in lithographic printing. The perceived density of a particular colour on the final print depends on the relative size of the halftone dots in that area. It has recently become the practice to carry out both the colour separation and the generation of halftone dots automatically using a colour separation scanner of the electronic dot generation (EDG) type. The four halftone separation images are processed electronically and imaged separately onto black and white silver halide films using a scanning laser device. The printing plates are prepared from these four silver images of their duplicates by contact exposure. A further development in this area is the increasing use of electronic pagination systems which can manipulate the digitally stored image data for the purpose of page composition.

A very desirable adjunct to the electronic scanner and pagination systems is a method of producing a colour proof directly from the electronically stored data without the requirement for intermediate black and white images on silver halide film.

Several methods for the production of colour proofs directly from electronically stored images are known. It is possible to represent the image on a colour cathode ray tube which may be photographed using any of the commercially available colour photographic materials. Alternatively, a black and white cathode ray tube may be photographed sequentially through different spectral filters. A more sophisticated device which has become available enables the image to be scanned in continuous tone form onto conventional photographic colour paper using blue, green and red light from argon-ion and helium-neon lasers. An additional method is to use the signals to a colour TV monitor to drive a continuous tone scanning device which uses a white light source through red, green and blue filters, to expose a diffusion transfer material.

There are fundamental limitations to the usefulness of the known direct colour proofing methods. In particular, it is not possible to record the image in the exact form that it will finally appear, that is, as superimposed yellow, magenta, cyan and black images of halftone structure.

In one respect this limitation is imposed by the selection of photographic colour materials which are available. All of the silver halide colour recording materials presently available which work by the subtractive principle produce images which are formed from dyes of three colours: yellow, magenta and cyan.

It is recognised in the printing industry that a colour proof should be an exact representation of the final printed image produced from four superimposed halftone images in yellow, cyan, magenta and black inks. This is not readily feasible using known colour photographic materials because the yellow, magenta and cyan images have to be modified to compensate for the absence of a black layer. The result is, therefore, one stage removed from a genuine proof.

A further drawback of known methods employing conventional colour photographic materials is the limitation that the final images comprise a continuous tone form rather than the halftone form of the final printed image. Since one of the principal reasons for making a proof is to check whether the sizes of the yellow, magenta, cyan and black halftone dots are correct to produce the desired hue and tone, the proof should be composed of halftone dots rather than continuously varying density calculated to produce the same visual effect. The current use of continuous tone exposures is probably dictated by (1) the resolution of the imaging devices in use, (2) the extra equipment cost for computing equivalent yellow, magenta and cyan halftones to the yellow, magenta, cyan and black halftones, (3) the low to medium contrast of commercially available photographic colour materials which makes them not ideal for halftone exposures, and (4) the limited resolution of conventional chromogenic colour paper.

For these reasons the direct colour proofing methods presently available have not achieved widespread acceptance except as a check on page layout and composition. It is still common practice to produce high quality colour proofs either by actually printing on a special press or by laminating together individual yellow, magenta, cyan and black images formed in various ways by contact exposure through halftone separations on black and white film. These methods are generally time consuming and often require a high level of skill on the part of the operator.

Our copending British Patent Application No. GB 2172118A discloses a radiation-sensitive element suitable for colour proofing comprising a substrate bearing at least four separate imaging media coated thereon, said imaging media including:
  (1) an imaging medium capable of forming a yellow image upon imagewise exposure and processing,
  (2) an imaging medium capable of forming a magenta image upon imagewise exposure and processing,
  (3) an imaging medium capable of forming a cyan image upon imagewise exposure and processing, and
  (4) an imaging medium capable of forming a black or a balancing black image upon imagewise exposure and processing,
each imaging medium having a maximum spectral sensitivity at a wavelength different from that of the maximum sensitivity of the other imaging media.

The four layer elements are particularly suitable for the generation of highly accurate half-tone colour proofs. The element is exposed by four independent sources of different wavelengths and image formation in each layer is attributable only to a single source. Thus each layer may be truly representative of the printing plate used to apply the corresponding ink in the printing process.

These elements are based on an entirely different principle to conventional colour photographic silver halide elements. Conventional elements produce a colour image by combinations of cyan, magenta and yellow dyes and the wavelength of the exposing radiation causes image formation with a dye having the same wavelength within its principal absorption band. Thus a black image is formed by a combination of all three dyes generated by exposure of different wavelengths and there is no provision for generating black or balancing black by exposure to a single wavelength. The four layer elements utilize false-colour address in order to separate magenta, cyan, yellow and black. Thus the wavelength of the exposing source used to indicate a particular photosensitive layer is entirely independent of the colour generated in that layer. For example, a magenta separation may be digitised and thereafter be used with an infra-red emitting source to expose an imaging layer sensitive to infra-red. This material, on processing, generates a magenta image. Hitherto false-colour address has been used only for specialised image recording, e.g. infra-red aerial photography and X-ray photography and the elements used have not possessed the four layers of the elements of the invention.

The imaging media of the elements are selected such that not only does each medium have a maximum spectral sensitivity at a wavelength which is different from the wavelengths of maximum spectral sensitivity of the other imaging media, but each imaging medium has a sensitivity at the wavelengths of maximum spectral sensitivity of the other imaging media which is not significant so that upon image-wise exposure of the element to radiation of a wavelength corresponding to the maximum spectral sensitivity of one of said imaging media of sufficient intensity to cause image formation in that medium image formation will be confined to said one imaging medium. Thus, upon irradiation by four independent sources having wavelengths corresponding to the maximum spectral sensitivity of the layers and subsequent processing, the elements of the invention form super-imposed yellow, magenta, cyan and black or balancing black images, each image being attributable to the image-wise exposure of the respective source.

The elements can be utilised as a colour proofing system which can produce four colour halftone proofs of high accuracy directly from electronically processed halftone separation image data. The digitally processed images are used to modulate independent sources of actinic radiation, e.g. light emitting diodes (LED), laser diodes or infrared emitting diodes (IRED), which are selected to emit at the wavelength of maximum spectral sensitivity of the medium corresponding to the digitally processed image. The four independent exposures may be conducted simultaneously or sequentially since the spectral sensitivities of the imaging media are selected such that exposure from one source will cause latent image formation in one imaging medium without significantly affecting the other imaging media.

For colour proofing applications, in which the yellow, magenta and cyan colourants are matched in hue saturation and density to the printing inks, it follows that a fourth black layer is needed to provide adequate black density since this would not be achieved by a sum of the yellow, magenta and cyan alone. However, the sensitisation of all four layers to different spectral regions, whilst possible, does impose stringent conditions on the spectral sensitivity characteristics of each of the four colour forming layers and the spectral emission characteristics of the light sources. These conditions would be considerably relaxed if there were a method of sensitising the four layers to just three wavelengths.

It has now been found that it is possible to utilize a four layer (yellow, magenta, cyan and black or balancing black) element sensitised to only three different wavelengths to obtain high quality, half tone, full colour images suitable for use in a colour proofing system.

SUMMARY OF THE INVENTION

According to the present invention there is provided a radiation-sensitive element suitable for the preparation of half-tone colour proofs comprising a substrate bearing at least four separate positive acting imaging media coated thereon, said positive acting imaging media including:

(1) an imaging medium capable of forming a yellow image upon imagewise exposure and processing, (2) an imaging medium capable of forming a magenta image upon imagewise exposure and processing, (3) an imaging medium capable of forming a cyan image upon imagewise exposure and processing, and (4) an imaging medium capable of forming a black image or balancing black image upon imagewise exposure and processing, each imaging medium (1), (2) and (3) having a maximum spectral sensitivity at a wavelength different from that of the maximum sensitivity of the other imaging media of (1) to (3), the imaging medium (4) having spectral sensitivity at each of the wavelengths of the maximum sensitivity of the other imaging media.

The imaging medium capable of forming a yellow image has a sensitivity at the wavelengths of the maximum spectral sensitivity of the cyan and magenta image forming media which is not significant so that upon imagewise exposure of the element to radiation of a wavelength corresponding to the maximum spectral sensitivity of the cyan or magenta image forming media of sufficient intensity to cause image formation in the cyan or magenta media, image formation will not occur in the yellow image forming medium.

The sensitivities of the cyan and magenta image forming media are similarly selected so that when the element is exposed to radiation so as to cause image formation in the cyan or yellow image forming media there will be no image formation in the magenta image forming medium, and when the element is exposed to radiation so as to cause image formation in the magenta or yellow image forming media ther will be no image formation in the cyan image forming medium.

The yellow image obtained after processing is formed in the non-exposed areas of the medium, the exposed areas being decolourised. In order for a yellow image to be visible in the processed photographic element, the element must be exposed to wavelengths corresponding to the maximum spectral sensitivity of the magenta and cyan image forming media in the area of the yellow image to cause decolourisation in the magenta, cyan and black or balancing black forming media in that region such that after processing only yellow colourant remains in that area of the photographic element.

The element of the invention has four colour-forming layers. A yellow layer (Y) sensitised to a first wavelength, a magenta layer (M) sensitised to a second wavelength, a cyan layer (C) sensitised to a third wavelength, and a black layer (or balancing black) (K) which is sensitised to all three wavelengths. All four layers are coated onto a base. The order of the layers from the top coat to the base may be Y, M, C then K (nearest base), but other permutations are possible. In all cases, however, it is the black layer or balancing black which must be sensitised to all three wavelengths.

Generally the sensitivity of the black or balancing black layer in the region of the wavelengths of maximum spectral sensitisation of each of the other layers is not less than 0.30 logE preferably not less than 0.15 logE below the sensitivity of each respective layer. Preferably, the sensitivity of the black or balancing black layer in the region of the wavelengths of maximum spectral sensitisation of the other layers is at least that of the other layers. Generally, the sensitivity of the black or balancing black layer will not be greater than 1.5 logE preferably not greater than 0.6 logE above the sensitivity of each of the other layers in the region of their wavelengths of maximum spectral sensitisation.

The imaging media must be positive acting. In other words, less colour-image-forming component, eg. dye, is present in areas which have been exposed by radiation of the relevant wavelength and developed, than is present in those areas which have not been exposed to actinic radiation. Also, the imaging process must be half-tone. Thus, at any given point on the material, each colour-forming component is present at substantially either maximum density or minimum density. For this reason, at any given point on the material the net colour can be colourless (eg. white on a white reflecting base), yellow, magenta, cyan, blue, green, red or black with no intermediate shades. On a macroscopic scale, intermediate shades and colours are produced by the correct dot size of each of the Y, M, C and K.

References to a "yellow" colour-forming component, dye or image herein refer to an absorbance principally within the 400 to 500 nm region of the visible spectrum.

References to a "magenta" colour-forming component, dye or image herein refer to an absorbance principally within the 500 to 600 nm region.

References to a "cyan" colour-forming component, dye or image herein refer to an absorbance principally within the 600 to 700 nm region.

The black layer can be a 'full' black in its own right absorbing light to the same general extent throughout the 400 to 700 nm region of the spectrum. However, generally the layer is a 'balancing' black, the function of which is to add to the density produced by the sum of the yellow, magenta and cyan so that the combination Y+M+C+'Balancing Black' gives a black of adequate density and similar to a "full" black.

Bases suitable for the proofing medium include those known in that art and include photographic grade papers and plastics films such as titanium dioxide loaded or vesicular polyester film. Normally a white reflecting base will be chosen and therefore where all four colour-forming components are significantly diminished, the background will appear white corresponding to the colour-forming components being rendered colourless. For other purposes the imaging media may be coated on transparent base, eg. biaxially orientated polyester film.

The exposure technique takes advantage of the fact that the 'black' colour-forming component (CFC) is only required in areas where the image itself is black. Thus, the black CFC is clearly not needed when producing white, yellow, magenta, cyan, blue, green or red. This requirement can be fulfilled by ensuring that the black CFC is not present wherever one or more of the other three CFC's are not present. This is achieved by sensitising the black image-forming layer to all three of the wavelengths of maximum sensitivity of the yellow, magenta and cyan image-forming layers. The sensitivity of the black image-forming layer at the three wavelength of maximum sensitivity of the three other image-forming layers should be essentially equal to or greater than the sensitivity of the most sensitive of the other layers at each wavelength. In areas of the image which are black, all four CFC's will be always present. For this reason, the black image-forming layer only needs to be a balance black image-forming layer.

The following Table 1 shows the CFC's in each layer which need to be present to produce the colour referred to above.

TABLE 1

| Colour Required | Colour Production CFC's Present | | | |
|---|---|---|---|---|
| | Y | M | C | K |
| White | No | No | No | No |
| Yellow | Yes | No | No | No |
| Magenta | No | Yes | No | No |
| Cyan | No | No | Yes | No |
| Blue | No | Yes | Yes | No |
| Green | Yes | No | Yes | No |
| Red | Yes | Yes | No | No |
| Black | Yes | Yes | Yes | Yes |

The individual imaging media generally consist of a single layer containing photographic silver halide, a spectral sensitising dye and associated positive-acting colour chemistry e.g. silver dye-bleach, dye diffusion transfer, leuco dye oxidation or colour reversal. However it is possible that some of all of the imaging media may be formed of two adjacent layers having the image forming components distributed therein. Furthermore it is possible to combine two or more imaging media into a single layer e.g. by microencapsulation of components.

The imaging media generate a visible, stable image after processing. The processing conditions will depend upon the particular type of imaging media used and may involve the application of external chemistry, e.g. in the form of development baths. In the case of dry silver systems as disclosed in U.S. Pat. No. 4,460,681 the processing simply requires the application of heat. In the interests of brevity the specification will simply refer hereinafter to imaging layers.

The requirements, described above, for a four colour halftone system for producing colour proofs direct from digitally processed images can be fulfilled in the following way.

Four light-sensitive silver halide layers capable of producing respectively yellow, magenta, cyan and black or balancing black images are coated on a substrate. The sensitivities of the individual cyan, magenta and yellow layers are matched to the output of three light emitting diodes and/or laser diodes and/or infra-red emitting diodes. The black (or balancing black) layer is sensitive to all three outputs. The light sources are mounted on a scanning device which is used to expose the sensitive coating. The four colour separation images are recorded simultaneously or sequentially in the yellow, magenta, cyan and black (or balancing black) producing layers.

The individual emissions of the three exposing devices are preferably selected from the range 400 to 900 nm, more preferably 500 to 900 nm, most preferably 550 to 900 nm. Whilst the individual emission could be selected from within a much broader wavelength band, there are certain advantages in selecting emissions within the range 500 to 900 nm, preferably 550 to 900 nm. Firstly, this region allows safelight handling of the elements in blue/green light. If required, the element may additionally be provided with a bleachable yellow filter to improve safelighting properties. A further reason for the choice of green yellow, red and infrared emitting sources is the ready availability of relatively high powered semiconductor devices in this region. Suitable, commercially available exposing sources include:

555 nm a green emitting (LED), part No. ESAY 3431 available from Stanley Electric Co.

580 nm a yellow emitting (LED), part No. ESB 63401 available from Stanley Electric Co.

660 nm a light emitting diode (LED), part No. H2K commercially available from Stanley Electric Company, Semiconductor Division, Japan 735 nm an emitting diode, part No. HLP40RA, commercially available from Hitachi Electronic Components (UK) Limited, 221-225 Station Road, Harrow, Middlesex 780 nm an infrared emitting diode (IRED), part No. HLP60RB, commercially available from Hitachi Electronic Components (UK) Limited, and a laser diode, part No. LT-024MD, commercially available from Sharp Corporation, Osaka, Japan 830 nm an infrared emitting diode (IRED), part No. HLP60RC, commercially available from Hitachi Electronic Components (UK) Limited, and a laser diode, part No. LT-015MD, commercially available from Sharp Corporation, Osaka, Japan The layers may also be exposed by radiation from 400 to 900 nm suitably filtered to allow passage of only a narrow band of radiation typically to simulate the solid state source emissions, and matching the wavelengths of maximum sensitivity of one or more of the colour forming layers. Such exposures may be undertaken in the contact mode.

In order to ensure that only the intended region is exposed by any particular light source, it is very desirable that the sensitive layers should exhibit high contrast or, more precisely, a very short exposure range from maximum density to minimum density. A high photographic contrast is also a requirement for accurate recording of halftone images where it is desirable that exposure will generate either a full response or zero response. Preferably the sensitometric contrast of each imaging layer is sufficiently high that the difference between the exposure required to give a density which is 5% of the maximum density above fog and the exposure required to give a density which is 90% of the maximum density above fog is less than 1.5 log exposure units.

Spectral sensitisation of silver halide by dyes produces a sensitivity peak which usually falls off much more sharply to the long wavelength side than it does to shorter wavelength. Increased colour separation can therefore be achieved if the sensitivities of the layers (at the wavelength of maximum spectral sensitivity) decrease from the layer of shortest wavelength sensitivity of the layer of longest wavelength sensitivity. Preferably the sensitivity decreases to a value less than 5% more preferably less than 2% of the sensitivity of the layer of shortest wavelength sensitivity. Generally, the minimum difference in sensitivity between any two layers is at least 0.2 log E units.

In particular circumstances it is possible to use an unsensitised silver halide layer as one of the imaging media in the element by using the inherent sensitivity of the silver halide which typically will not extend to longer wavelengths than about 450 nm. When an unsensitised layer is used it must be placed as the layer first exposed by the radiation and must be associated with a corresponding filter layer to block transmission of the radiation further into the construction thereby avoiding exposing the spectrally sensitised layers. Such a filter layer will absorb in the UV and visible up to the limit of inherent silver halide sensitivity, typically 450 nm. The filter layer will be chosen so as to bleach or decolourise on processing. The wavelengths of maximum sensitivity of the remaining sensitised layers are selected to avoid the inherent sensitivity of the unsensitised layer.

The absorption of radiation corresponding to the intrinsic spectral sensitivity of silver halides is described for example in The Theory of The Photographic Process, Mees and James, Third Edition, Pg. 39.

At present there are no suitable solid state sources emitting below about 550 nm but suitable exposure conditions may be achieved employing filtered, narrow wavelength light band sources, normally in contact exposure mode.

Normally the element will be exposed to three independently modulated sources each emitting radiation of a wavelength corresponding to the wavelength of maximum sensitivity of a respective medium. The source's emission generally corresponds to the maximum absorbance of the photosensitive layer. This may include a precise correspondence of emission and absorption wavelengths or a slight mismatch.

The difference between the wavelength of maximum emission of the source and the wavelength of maximum absorbance of the photosensitive layer will normally be less than 40 nm preferably less than 20 nm, most preferably less than 10 nm. It will be appreciated that the source may be monochromatic e.g. as in laser exposure, or it may emit over a narrow band e.g. as in emitting diode exposure. Additionally the sensitising dyes may have relatively sharp or broader absorbances. Where a sensitising dye has a sharp absorbance the mismatch tolerance with the source will be reduced. Typically sensitising dyes used at 580 nm will have a sharper cut-off at longer wavelength than those used at 800 nm.

In practice a corresponding source and sensitising dye will be chosen so that the source will cause significant exposure of the sensitised layer but not significant exposure of any other layers. Generally a source would be chosen to emit on or close to the wavelength of maximum spectral sensitivity of the layer with the sensitivity of the layer at the wavelength of peak emission of the source dropping by not more than 0.4 logE preferably not more than 0.1 logE, most preferably not more than 0.05 logE relative to the maximum spectral sensitivity possessed by the sensitised layer.

It is of fundamental importance for colour proofing that the images in the four sensitive layers are recorded in halftone dot form. The significance of halftone structure to the utility and accuracy of the proof has already been described. A further advantage of recording in halftone form is that it allows a much greater tolerance in the exposing power of the exposing device than would be permissible for recording a continuous tone image. Another practical advantage of recording the images in halftone form concerns of black or balancing black image-forming layer. It is generally necessary to form a black image using a mixture of yellow, magenta and cyan dyes together in the same layer. If a continuous tone imaging process were used it would be necessary to exactly match the rates of formation of the yellow, magenta and cyan components of the black (or balancing black) image in order to maintain a neutral black hue throughout the range of intermediate grey tones. However, if the black tonal range is achieved using halftone dots there is no such requirement, since no intermediate levels of dye formation are used, only complete dye density in the dots exists or zero dye density between the dots.

The image-forming layers represented in the elements of the invention are preferably silver halide emulsions which may be of the silver dye-bleach type or in which the dye images are formed by a dye diffusion transfer process. Silver dye-bleach systems are preferred because of high resolution and inherent high contrast of such systems, these being desirable characteristics for halftone recording. An additional advantage is that the density and hue of the various layers may be controlled during film manufacture.

Silver dye-bleach, dye diffusion transfer and colour reversal systems are well known and are disclosed, for example, in "The Theory of the Photographic Process", 4th Edition, Mees & James, Macmillan Publishing Co. Inc., pages 353 to 372, "Dye Diffusion Systems in Colour Photography", Van de Sande, Angew. Chem. Int. Ed. Engl. 22 (1983), pages 191 to 209, and "Imaging Systems", Jacobson & Jacobson, Focal Press, 1976 pages 86 to 103.

A comprehensive review of chemical mechanisms by which imagewise dye diffusion may be achieved is given, for example, in "Dye Diffusion Systems in Colour Photography" Angewandte Chemie International Edition 1983, 22, 191–209.

In conventional colour photographic materials it is usual for each of the three sensitive layers to form a dye image which is complementary in colour to the light to which that layer is sensitive. In the present invention the image forming layers may generate an image the colour of which is unrelated to that of the exposing source. Thus, subject to some restrictions, each of the colour, image-forming layers of the present invention may be sensitive to any of the three exposing wavelengths chosen. Furthermore, several variations in the order of coating the four layers on the base are possible. In the case of a four colour, silver dye-bleach material some restrictions are imposed by the presence of the image dyes during exposure. In this case it is preferable that the yellow, cyan and magenta dyes are present in the layers furthest from the base in order to afford some safelight protection to the lower layers. Any layers which are sensitive to wavelengths shorter than about 700 nm may be placed nearer to the exposing source than the layers which contain the cyan and black dyes, although this is not essential.

The layer which contains the cyan dye, if suitably placed, may act as a filter layer to increase the colour separation between any layers sensitive to wavelengths shorter than 700 nm and any layers of wavelength longer than 700 nm. Additional bleachable filter layers may be coated above the sensitive layers in order to improve the safelight handling of the construction. These filter layers may contain bleachable dyes or, in the case of a silver dye-bleach construction, yellow colloidal silver which may also be in combination with an azo dye.

The light sensitive layers may be coated on any suitable opaque or transparent base. The construction preferably incorporates an antihalation backing, or in the case of opaque base an antihalation underlayer. The antihalation layer may contain bleachable dyes or black colloidal silver may be used, or a strippable layer of pigment e.g. carbon black, and mixtures of dyes may be used.

A wide variety of sensitising dyes may be used to sensitise the individual photosensitive layers to yellow, red and near infrared light; these have been well documented in the literature. There is no particular restriction as to the composition of the silver halide emulsion which may be used in this invention although emulsion types which produce high photographic contrast are preferred. Methods for the preparation of high contrast silver halide emulsions are well known.

Silver halide emulsions of narrow grain size distribution are particularly useful in this respect. The photographic contrast of the emulsion may be further increased by the incorporation of elements of Group 8 of the Periodic Table, such as rhodium. The effect of rhodium is not only to increase the contrast of a silver halide emulsion but to decrease the sensitivity. The effect on emulsion sensitivity may be used to advantage in providing a sensitivity differential between the emulsion layers thereby improving colour separation as described above.

As described above, the radiation-sensitive elements of the invention may be exposed by three independent sources of actinic radiation which are modulated to represent the particular colour requirement of the desired image. Whilst the exposures may take place sequentially it is preferred that the elements are exposed to the three sources simultaneously in order to avoid the necessity for scanning the elements upon three separate occasions. An element is scanned in a raster fashion, either by moving the element rapidly in one direction whilst the exposing beams are moved more slowly in a perpendicular direction, or by moving the writing beams rapidly in one direction whilst the element is moved more slowly in a perpendicular direction, or by moving the writing beams rapidly in one direction and more slowly in a perpendicular direction. Preferably a combination of sources of the same wavelength is used for exposure so that dot arrays of each wavelength are formed. This permits faster scanning rates.

Suitable exposure devices comprise three independent sources of radiation having a peak emission within the range 550 to 900nm and of substantially different wavelength, preferably each source having a peak wavelength differing by at least 20 nm from that of any other of said sources, constructed and arranged such that each source or its emission may be modulated and the emitted radiation from said sources may simultaneously expose a radiation-sensitive element. Preferably there is an intensity variation between the sources of different wavelength such that the intensity of the source of longest wavelength will be at least ten times greater than the intensity of the source of shortest wavelength. The sources may comprise lasers, LED's, IRED's or any combination thereof and preferably semiconductor sources.

The exposure device may comprise more than one independently modulated sources at each of the different wavelengths, e.g. to provide an exposure head with six or more such sources at each of the different wavelengths. Arrays with tens or hundreds of independently modulated sources at each wavelength may also be used. The individual sources may be mounted together on a single chip in the form of an array. Such an array may consist of a single line of adjacent sources, or two or more staggered lines of sources, e.g. 5×2, 10×2, 12×2, etc. The arrays of sources of different wavelengths may be mounted together on a single chip. In this case, there would be one or more lines of sources emitting at one wavelength, and parallel to this would be one or more lines of sources emitting at one or more of the other wavelengths. The arrays of sources of different wavelengths may be mounted on separate chips. Radiation from the sources may be conveyed to an exposure head via optical fibres and the apparatus may include a lens system to focus each beam of radiation.

When material is exposed on a multi-wavelength colour separation scanner for each point on the image, four signals are initially present that indicate which of the Y, M, C and K inks will be printed at that point. To expose the material correctly these four signals must be reduced to just three signals which are then used to control each of the three light sources. The electronic logic necessary to perform this reduction is shown in FIG. 1 of the accompanying drawings. The requirement is that at any given point the yellow image layer, for example, should be exposed only if there is no yellow dot present and no black dot present at that point.

The element may be exposed on a contact frame through a black and white colour separation, using a narrow wavelength band filtered source to match the sensitisation of the corresponding layer. Here exposure is not conducted in raster fashion.

The invention will now be illustrated by the following Example.

EXAMPLE

In order to illustrate an implementation of the invention two multilayer constructions were prepared. The first was a conventional three colour YMC material to be used as a control. The second was a four colour YMCK material containing a panchromatic balancing black layer as described earlier.

Two properties of the four layer material need to be demonstrated in order to prove the feasibility of the invention. Firstly, it must be shown that a four layer YMCK material can be produced in which the balancing black layer is sensitive to the same wavelengths as each of the other three layers. Secondly, the presence of the balancing black layer must be shown to enhance the overall density of the black formed from the sum of yellow, magenta, cyan and balancing black image forming layers.

The production of the materials and their subsequent sensitometric testing will now be described.

Silver Halide Emulsions

Two different emulsions (Emulsions A & B hereinafter) were used in the multilayer construction in order to ensure that the balancing black layer was at least as sensitive to each of the three exposing wavelengths as were the singly-sensitised layers.

Emulsion A was used for each of the three singly-sensitised layers, each layer containing one appropriate sensitising dye together with one appropriate colour-forming azo dye. The emulsion was a silver chlorobromide emulsion comprising 70 mole percent of AgCl and 30 mole percent of AgBr of mean grain size 0.4 micron and with a narrow grain size distribution prepared by a conventional double-jet technique. The emulsion was sulphur and gold sensitised and stabilised with a tetraazaindene.

Emulsion B was used for the balancing black layer and sensitised to all three wavelengths by the addition of three sensitising dyes. This emulsion was a silver iodobromide emulsion comprising 3 mole percent AgI and 97 mole percent AgBr of mean grain size 0.7 micron and with a wide grain size distribution. The emulsion was prepared by a two-step emulsification procedure under ammoniacal conditions with a single jet procedure at each emulsification step. The emulsion was sulphur and gold sensitised.

Coating Procedure 4 mil (100 micron) Bexford white vesicular polyester base was double-slot coated with an antihalation underlayer (AHU) (consisting of a black colloidal silver dispersion in gelatin) and a plain gelatin layer overcoat. The resulting material was then double-slot coated with a dye-sensitised emulsion underlayer (which also contained the azo dye) and a plain gelatin overcoat. This step was then repeated for each of the other colour-forming layers. A colloidal silica dispersion was added to the final gelatin overcoat, i.e. the top-coat of the multilayer construction. Two multilayer constructions were coated; one without a balancing black layer (control) and one with a balancing black layer (invention) sensitised to all three exposing wavelengths. These two multilayer constructions are shown schematically in FIG. 2 of the accompanying drawings.

Emulsion Layer Formulation

A summary of the emulsion layer formulation is given in Table 2.

Sensitising dyes, details of which are shown in Table 3, were added whilst stirring the emulsions at 45° C. This was followed by the addition of 0.5% aqueous Leucophor BCF solution (commercially available from Sandoz).

After 30 min, 95 g of 10% ossein gelatin was added followed by the appropriate azo dye solution. Finally, 4.5 ml of 2% Triton X-200 surfactant (commercially available from Rohm & Haas) and 9 ml of 2% formaldehyde solution were added before the pH of the solution was adjusted to 6.0 and the weight made up to 300 g.

The emulsion layers were coated to give silver coverages of 0.2, 0.4, 0.2 and 0.25 g/m$^2$ for layers I, II, III and IV respectively. Gelatin interlayers were coated to give a 2 micron dry thickness whilst the protective top coat was coated to give a 0.6 micron dry thickness.

In this example, the balancing black image-forming layer contained cyan azo dye only. In practice, the balancing black image-forming layer may also contain amounts of yellow and magenta dyes. However, due to the nature of the printing inks, the main purpose of the balancing black is to boost the density in the red part of the spectrum. Hence the choice of cyan as balancing black is appropriate.

Azo Dyes

Figure 3:
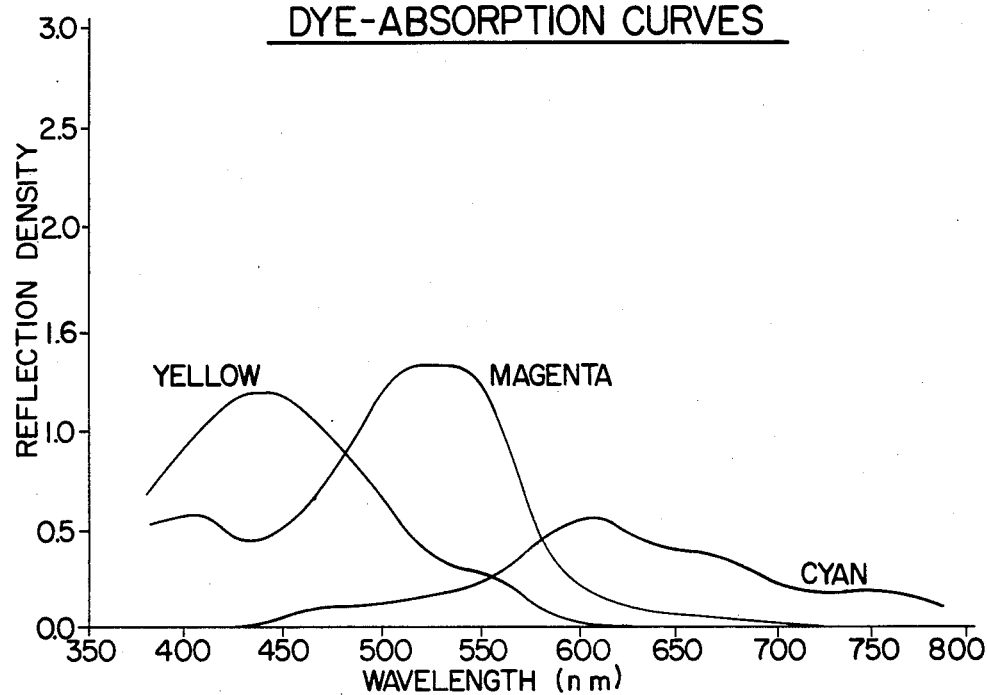

The azo dyes used have the structures shown in Table 4. Their absorption curves are shown in FIG. 3 of the accompanying drawings.

TABLE 2

EMULSION LAYER FORMULATION

| Emulsion Layer Number | Exposing Wave-Length | Emulsion (moles AgX) | Sensitising Dye Addition | 0.5% Leucophor BCF aq. Solution | Azo Dye (Aqueous solution) |
|---|---|---|---|---|---|
| I | 800 nm | 0.05 M(A) | 0.38 ml 0.05% S1 70:30 MeOH:DMF | 1.5 ml | 75 ml 0.5% cyan |
| II | 660 nm | 0.03 M(A) | 3.00 ml 0.2% S2 in MeOH | 3.0 ml | 75 ml 3% magenta |
| III | 580 nm | 0.015 M(A) | 1.05 ml 0.2% S3 in MeOH | 1.5 ml | 75 ml 1% yellow |
| IV | 580 nm 660 nm 800 nm | 0.019 M(A) | 1.8 ml 0.2% S3 1.8 ml 0.2% S2 0.38 ml 0.05% S1 | 2.25 ml | 75 ml 0.5% cyan |

MeOH = methyl alcohol
DMF = dimethyl formamide

Sensitizing Dye Structures

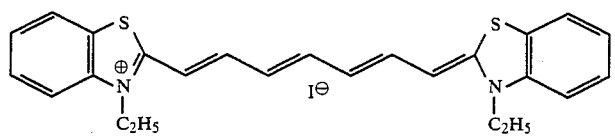

S1

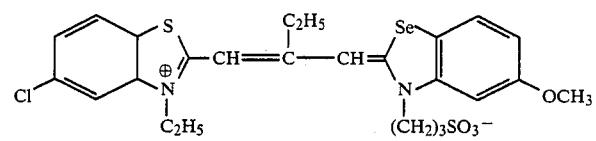

S2

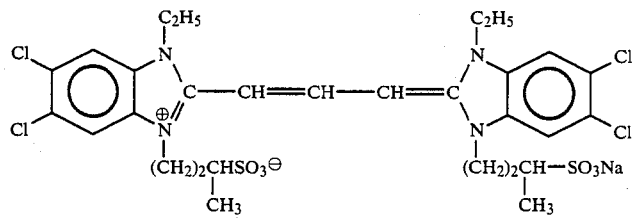

S3

AZO DYE STRUCTURES

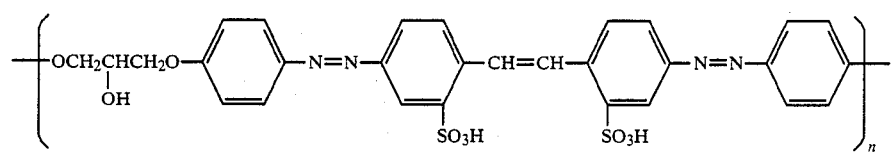

YELLOW

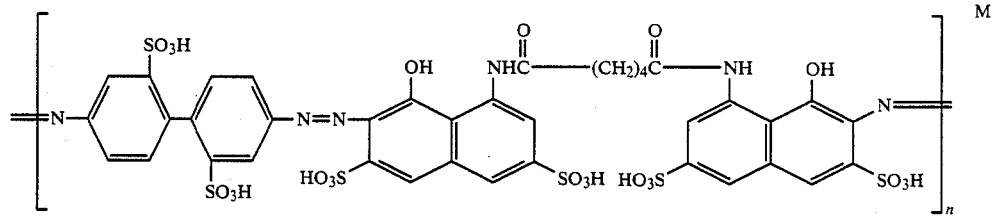

MAGENTA

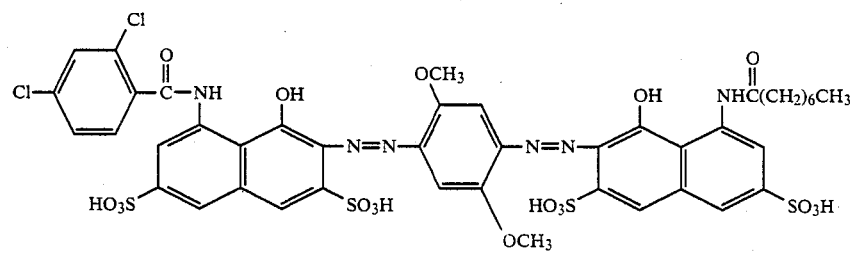

CYAN

Sensitometry

The samples were exposed to narrow band filtered radiation approximatey centred on wavelengths of 580, 660 and 800nm. The exposure source comprised a Braun Flash Gun Type F910, colour temperature 5600° K., 12500 beam candle power seconds, exposure time 0.004 sec. Broad band filters transmitting radiation between:

560 to 610 nm (580 nm)
635 to 680 nm (660 nm)
770 to 820 nm (800 nm)

were employed to expose the individual samples. The intensities at the film plane for each wavelength were 580 nm $0.12 \times 10^{-4}$ watts cm$^{-2}$
660 nm $0.12 \times 10^{-4}$ watts cm$^{-2}$
800 nm $0.73 \times 10^{-4}$ watts cm$^{-2}$ In this way, by a suitable combination of exposures at none, one, two or all three of these wavelengths, the colours white, yellow, magenta, cyan, red, green, blue and black can all be generated. After exposure each sample was developed in 3M RDC rapid access developer at 40° C. for 30 seconds, treated with Ilford Cibachrome P22 dye bleach and fix solution at 40° C. for 60 seconds each and thereafter washed and dried.

Figure 4:
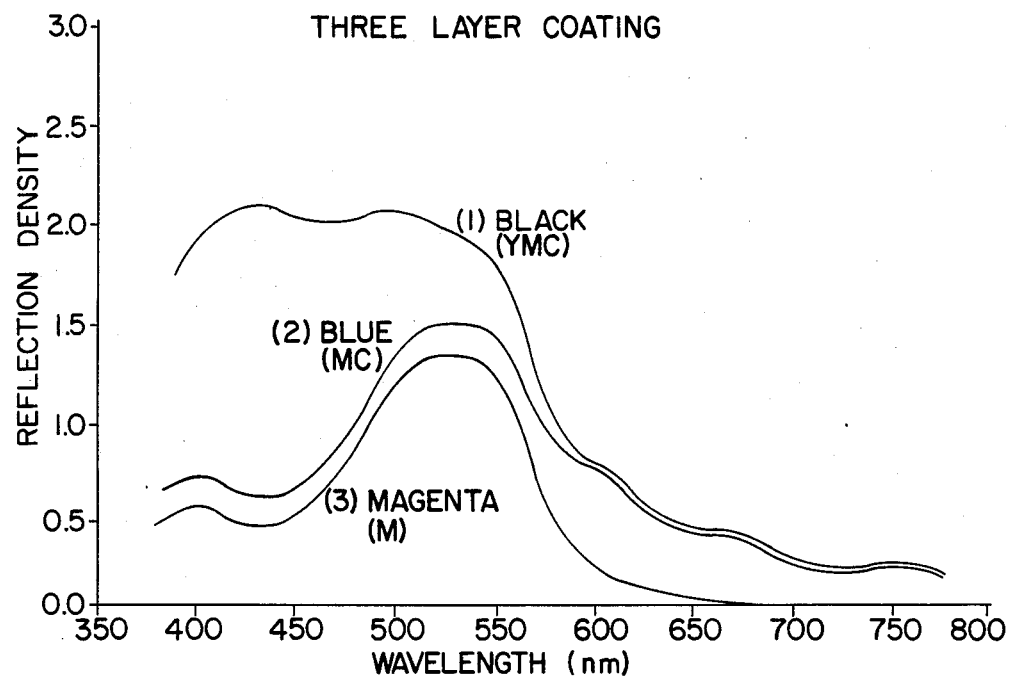
Figure 5:
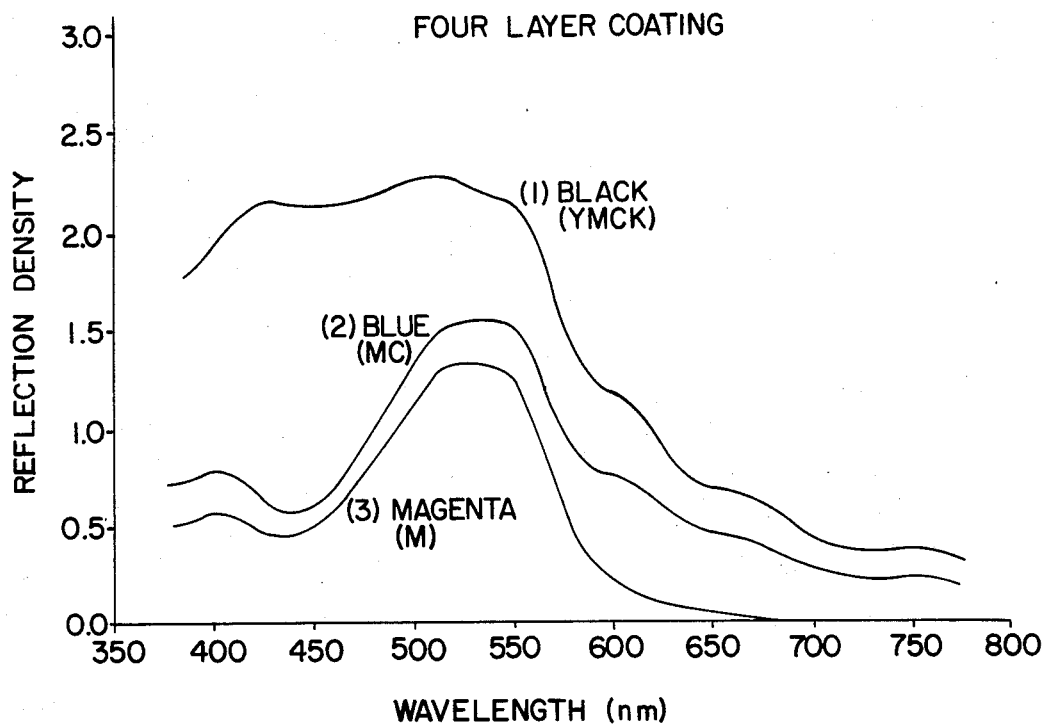

Examples of the results of such exposures are shown in FIGS. 4 and 5 of the accompanying drawings for the control element and element of the invention respectively.

In both diagrams, line (1) shows the absorption spectra of the unexposed materials in which each of the dyes is still present. (the result is nominally black although in a practical coating the cyan density would be higher.) Line (2) shows the absorption spectra after an exposure to light of wavelength 580 nm. It can be clearly seen by comparing FIG. (4) and (5) that the 580 nm exposure has caused just the yellow dye to be bleached in the three layer material (FIG. 4) whilst in the four layer material (FIG. 5) both the yellow and the balancing black dye have been removed. Thus as required, the balancing black layer is shown to be at least as sensitive to light of wavelength 580 nm as is the yellow layer. Going one stage further, line (3) in FIGS. (4) and (5) shows the absorption spectra after an exposure to light of wavelengths 580 and 800 nm. In this case, just magenta dye is left.

Similar tests with single exposures at each of the other two wavelengths (660 and 800 nm) have shown that once again the balancing black layer is sufficiently sensitive. This is confirmed in Table 6 in which the sensitivity of each layer to each wavelength is listed. The results presented in Table 6 were derived by exposing the samples through a 0-4D neutral density wedge to light of wavelengths 580, 660 and 800 nm. The position along the sample at which each dye was bleached to 0.1 units above the minimum optical density, ie. Dmin+0.1 was located using a scanning reflection densitometer. From a knowledge of the density of the wedge at this position, the exposure time and the light intensity incident at the wedge, the total exposure in ergs/cm² necessary to bleach each dye was calculated.

TABLE 6

Sensitometry Results
(numbers represent exposures in erg/cm² required to bleach to 0.1 above Dmin)

| Exposure Wavelength | Yellow Layer | Magenta Layer | Cyan Layer | Black Layer |
|---|---|---|---|---|
| 580 nm | 4.80* | 67.8 | — | 0.48 |
| 660 nm | 10500 | 33.1* | 3310 | 1.10 |
| 800 nm | — | — | 400* | 16 |

— indicates exposure required was too large to be measured from processed sample.
*indicates wavelength of maximum sensitivity for each of yellow, magenta and cyan.

Having shown that the adequate sensitivity of the balance black layer, the second property that must be demonstrated is the improved density of the 'YMCK black' compared to the 'YMC black'. This effect can be seen by referring back to FIGS. (4) and (5). The increased density to light of wavelength 600 nm and above brought about by the cyan in the balancing black layer within the element of the invention is clearly evident.

We claim:

1. A radiation-sensitive element suitable for the preparation of half-tone colour proofs comprising a substrate bearing at least four positive acting silver halide imaging media coated thereon, said imaging media including:
   (1) a positive acting silver halide imaging medium capable of forming a yellow image upon imagewise exposure and processing,
   (2) a positive acting silver halide imaging medium capable of forming a magenta image upon imagewise exposure and processing,
   (3) a positive acting silver halide imaging medium capable of forming a cyan image upon imagewise exposure and processing, and
   (4) a positive acting silver halide imaging medium capable of forming a black image or a balancing black image upon imagewise exposure and processing, each imaging medium (1), (2) and (3) having a maximum spectral sensitivity at a wavelength different from that of the maximum sensitivity of the other imaging media of (1) to (3), the imaging medium (4) having spectral sensitivity at each of the wavelengths of the maximum sensitivity of the three other imaging media.

2. An element as claimed in claim 1, in which each imaging medium of the media (1), (2) and (3) has a sensitivity at the wavelengths of the maximum spectral sensitivity of the other imaging media (1), (2) and (3) which is not significant and the imaging medium (4) having a sensitivity at the wavelengths of maximum sensitivity of each of the media (1), (2) and (3) so that upon imagewise exposure of the element to radiation of a wavelength corresponding to the maximum spectral sensitivity of one of the imaging media (1), (2) and (3) of sufficient intensity to cause image formation in that medium, image formation will be confined to said one imaging medium of the media (1), (2) and (3) and image formation will occur in medium (4).

3. An element as claimed in claim 1, in which the light sensitive media (1), (2) and (3) each contain silver halide emulsions with maximum spectral sensitivity at different wavelengths chosen from the region 400 to 900 nm.

4. An element as claimed in claim 1 in which the wavelength corresponding to the maximum spectral sensitivity of one of said imaging media (1), (2) and (3)

differs from the wavelength corresponding to the maximum spectral sensitivity of all of said other imaging media (1), (2) and (3) by at least 20 nm.

5. An element as claimed in claim 1, in which the sensitivities of the media (1), (2) and (3) (at the wavelength of maximum spectral sensitivity) decrease from the medium of shortest wavelength sensitivity to the medium of longest wavelength sensitivity by at least 10 times.

6. An element as claimed in claim 1, in which the sensitometric contrast of each imaging medium is sufficiently high that the difference between the exposure required to give a density which is 5% of the maximum density above fog and the exposure required to give a density which is 90% of the maximum density above fog is less than 1.5 log exposure units.

7. An element as claimed in claim 1, in which the dye images are formed by a silver dye-bleach process or a dye diffusion transfer process.

8. An element as claimed in claim 1, which is overcoated with a bleachable filter medium absorbing ultraviolet and/or blue and/or green light.

9. An element as claimed in claim 1 which is of the dye bleach type and is overcoated with a filter medium containing yellow colloidal silver and a yellow or magenta azo dye.

10. An element as claimed in claim 1 in which the image forming media are coated on the substrate in the following order:
    (1) Black or balancing black image forming medium
    (2) Yellow or cyan image forming medium
    (3) Cyan or yellow image forming medium
    (4) Magenta image forming medium 11. A process of forming a half-tone colour image comprising exposing a material as claimed in claim 1 to three independently modulated sources of radiation which sources are selected such that each source emits radiation at a wavelength in the region of the wavelength of maximum sensitivity of a respective medium of imaging media (1), (2) and (3).

12. A process as claimed in claim 11, in which the sources are selected from light emitting diodes, infrared emitting diodes, semi-conductor lasers and any combination thereof, each of the sources of radiation emitting in the region of 500 to 900 nm.

13. A process as claimed in claim 11 in which the element is scanned in a raster fashion by the sources of radiation.

14. A process as claimed in claim 11 in which the peak wavelength separation between any two different sources is at least 20 nm.

15. A process as claimed in claim 11 in which the intensities of the sources at the film plane increase from the source of shortest wavelength to the source of longest wavelength radiation which increase is at least 10 times.

16. A process as claimed in claim 11 in which there is an array of sources of radiation emitting at the same wavelength for each of the three wavelengths corresponding to the wavelength of maximum sensitivity of a respective medium.

17. A radiation-sensitive element suitable for the preparation of half-tone colour proofs comprising a substrate bearing at least four positive acting silver halide imaging media coated thereon, said imaging media including:
    (1) a positive acting silver halide imaging medium capable of forming a yellow image upon imagewise exposure and processing,
    (2) a positive acting silver halide imaging medium capable of forming a magenta image upon imagewise exposure and processing,
    (3) a positive acting silver halide imaging medium capable of forming a cyan image upon imagewise exposure and processing, and
    (4) a positive acting silver halide imaging medium capable of forming a black image or a balancing black image upon imagewise exposure and processing, each imaging medium (1), (2) and (3) having a maximum spectral sensitivity at a wavelength different from that of the maximum sensitivity of the other imaging media of (1) to (3), the imaging medium (4) having spectral sensitivity at each of the wavelengths of the maximum sensitivity of the three other imaging media and wherein each of said three silver halide emulsions (1), (2) and (3) have wavelengths of maximum sensitivities which differ from the wavelength corresponding to the wavelength of maximum spectral sensitivity of the others of said three silver halide emulsions by at least 20 nm, and wherein the sensitivities of the media (1), (2) and (3) at the wavelength of maximum spectral sensitivity decrease from the medium of shortest wavelength to the medium of longest wavelength by a factor of at least 10.

* * * * *